United States Patent [19]
Abbott et al.

[11] Patent Number: 5,217,906
[45] Date of Patent: Jun. 8, 1993

[54] METHOD OF MANUFACTURING AN ARTICLE COMPRISING AN OPTO-ELECTRONIC DEVICE

[75] Inventors: Robert R. Abbott, Scotch Plains; William C. King, Chatham, both of N.J.

[73] Assignee: AT&T Bell Laboratories, Murray Hill, N.J.

[21] Appl. No.: 802,120

[22] Filed: Dec. 3, 1991

[51] Int. Cl.⁵ .......................................... H01L 21/66
[52] U.S. Cl. .......................................... 437/8; 437/54; 437/905; 437/209; 385/90; 385/94
[58] Field of Search .............. 437/8, 7, 905, 906; 148/DIG. 99; 385/88, 90, 91, 92, 93, 94; 357/19

[56] References Cited

U.S. PATENT DOCUMENTS

| | | | |
|---|---|---|---|
| 4,329,659 | 5/1982 | Chen | 385/88 |
| 4,678,265 | 7/1987 | Fink et al. | 385/88 |
| 4,679,908 | 7/1987 | Goodwin | 385/91 |
| 4,722,587 | 2/1988 | Thorsten | 385/88 |
| 4,808,816 | 2/1989 | Flickinger et al. | 385/88 |
| 4,826,272 | 5/1989 | Pimpinella et al. | 385/92 |
| 4,892,374 | 1/1990 | Ackerman et al. | 357/19 |
| 5,029,965 | 7/1991 | Tan | 385/90 |

FOREIGN PATENT DOCUMENTS 63-44118   2/1988 Japan.
63-127210  5/1988 Japan.
63-193112  8/1988 Japan.

Primary Examiner—Brian E. Hearn
Assistant Examiner—Michael Trinh
Attorney, Agent, or Firm—Eugen E. Pacher

[57] ABSTRACT

The inventive method is advantageously used in the manufacture of an article that comprises an opto-electronic device (e.g., LED or photodetector diode) that has a substantially planar radiation-emitting or receiving (first) surface region. The method comprises preliminarily positioning the end of a length of optical fiber relative to the first surface region, and causing radiation from a radiation source to be emitted from the fiber end so as to be incident substantially normally on the first surface region. A part of the radiation is reflected, collected by the fiber end, and transmitted to a power meter. The output of the power meter (or a quantity derived therefrom) is compared to a pre-determined measurement value and, if indicated by the comparison, the position of the fiber end is adjusted. A significant aspect of the invention is the existence of an easily measured relationship between the reflected power received by the power meter and the distance $\Delta z$ of the fiber end from the first surface region. The relationship is substantially the same for all devices of a given design, making possible automatization of $\Delta z$-positioning.

5 Claims, 2 Drawing Sheets

METHOD OF MANUFACTURING AN ARTICLE COMPRISING AN OPTO-ELECTRONIC DEVICE

FIELD OF THE INVENTION

This invention pertains to methods of making an article that comprises an opto-electronic device such as a light emitting diode (LED) or a photodetector.

BACKGROUND OF THE INVENTION

In the manufacture of articles that comprise an opto-electronic semiconductor device (e.g., a LED or a PIN detector) it is frequently necessary to precisely position an end of an optical fiber relative to the device. For instance, if the device is a LED or a detector diode then it is frequently necessary to position a fiber end a predetermined distance above the device surface and centered with, respectively, the beam of radiation that is emitted by the LED, or the photosensitive region of the detector. The necessity can arise at many points during the manufacturing process, for instance, at a relatively early stage for, e.g., device testing purposes, or during relatively late assembly steps (e.g., when positioning and securing the end of a fiber "pigtail" relative to the device).

There are known techniques for centering the end of a length of fiber with the relevant portion of the device surface. For instance, software-controlled equipment for positioning the end of optical fiber relative to the beam of radiation emitted by an LED is available from Newport Corporation of Mountain View, Calif. While these techniques typically can satisfactorily automatically position the fiber end in the x-y plane (i.e., in the plane normal to the axis of the emitted beam), it has so far proven difficult to automatically precisely position the fiber end a small predetermined distance (e.g., 50 μm) from the relevant device surface, and to consistently achieve this "Δz" adjustment without contacting the device surface with the fiber end.

Because of the referred-to difficulty the final Δz adjustment has, up to now, typically been made manually, by a trained operator using an optical microscope. This is obviously an expensive process step, and it would be highly desirable to have available an automatic technique for making the final Δz-adjustment. This application discloses such a technique, especially useful for devices wherein the relevant portion of the device surface is substantially flat.

SUMMARY OF THE INVENTION

In a broad aspect the invention is a manufacturing method which comprises positioning the end of an optical fiber relative to a first region of an opto-electronic semiconductor device, typically a LED or a photodetector. (The "first region" is that essentially planar portion of the device surface through which, during normal device operation, optical radiation is emitted from, or received by, the device). Positioning typically comprises conventional positioning of the fiber end in an x-y plane at a non-final distance from the first region, and furthermore comprises a novel step of adjusting Δz, the distance between the fiber end and the active region of the device. The novel step is readily automatized, and in preferred embodiments of the inventive method fiber positioning is fully automatic.

More particularly, the invention is a method of making an article that comprises an opto-electronic device that comprises a semiconductor body and means for making electrical contact to the body. The method comprises providing the body and making appropriate contact thereto (i.e., in a manner consistent with normal operation of the device). It also comprises positioning a length of optical fiber relative to the semiconductor body such that the proximal end of the fiber is spaced from, and facing, the first region, with at least the proximal end of the fiber being essentially parallel to the z-direction (the "z-direction" is the direction normal to the first region and to the x-y plane). If the device is a LED then the x-y positioning step may involve detection of radiation emitted by the LED and coupled into the proximal end of the optical fiber.

The method further comprises adjusting the relative position of the semiconductor body and the optical fiber such that the proximal end of the fiber is spaced a predetermined distance Δz from the first region. Significantly, this step comprises causing test radiation from a test radiation source to be transmitted, through an optical fiber transmission path that comprises the length of optical fiber and optical fiber splitter means, to the proximal end of the optical fiber and therefrom to the first region of the semiconductor device. At least a portion of the test radiation incident on the device is reflected therefrom, is returned to the proximal end of the fiber and is coupled into the fiber core such that test radiation is transmitted through the optical fiber to the fiber splitter means. At least a part (exemplarily 50%) of the returning test radiation is being transmitted from the splitter means to optical power-responsive means (e.g., an optical power meter) having an output that is substantially proportional to the optical power received by the power-responsive means.

The method further comprises comparing the output of the power-responsive means, or a quantity derived therefrom (collectively "measurement value"), to a predetermined set-point value, and, if indicated by the result of the comparison, adjusting the distance of the proximal fiber end relative to the first region such as to reduce the difference between the set-point value and said measurement value. It will be understood that in practice this step can be iterated until the difference between set-point value and measurement value is reduced below a predetermined acceptable deviation value. However, iteration is not a requirement, and in at least some embodiments it is expected that a single adjustment will suffice.

An important aspect of the inventive method is the existence of a well-defined relationship between P, the reflected power detected by the power-responsive means, and the spacing between the proximal end of the optical fiber and the first region of an appropriate semiconductor device. This relationship is substantially the same for all members of a given device design but typically will depend on the device design. The relationship that is associated with any particular device design is readily established by simple measurements, as will be recognized by those skilled in the art. Choice of an appropriate radiation source will typically depend on the semiconductor material of the device. Exemplary radiation sources that may be useful in the practice of the invention are LEDs or semiconductor lasers emitting in the visible or infrared.

DETAILED DESCRIPTION OF EXEMPLARY PREFERRED EMBODIMENTS

Figure 1:
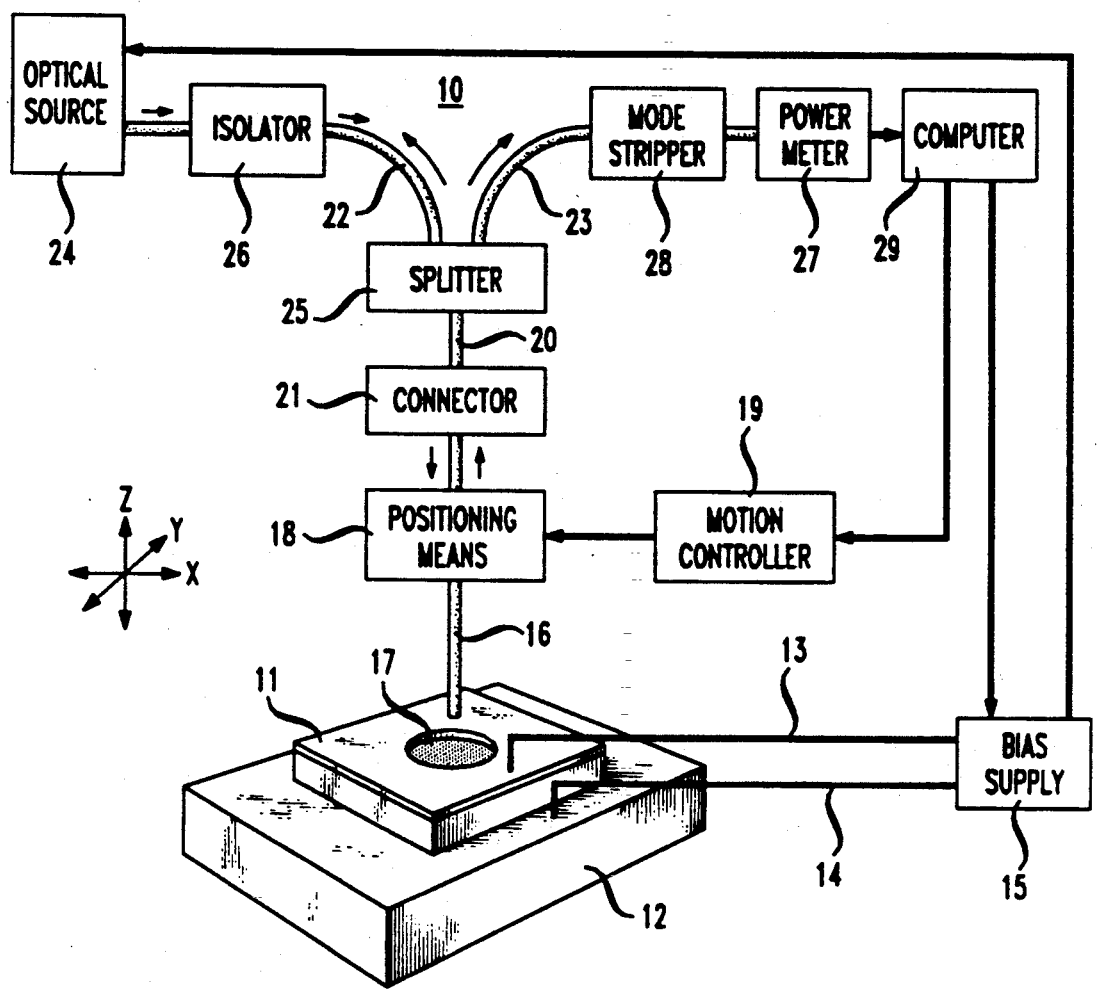
FIG. 1 schematically depicts exemplary apparatus that can be used to practice the invention.

FIG. 1 schematically depicts relevant parts of apparatus 10 that can be used to practice the invention. Optoelectronic semiconductor device 11 (exemplarily a LED) is mounted on a body 12, conventionally referred to as a "header". Electrical contacts 13 and 14 make it possible to flow current through the device, the current supplied by bias supply 15. A length of optical fiber 16 is positioned above first region 17 and held in commercially available positioning means 18. The positioning means allow positional adjustment of the proximal fiber end in the x, y, and z direction, as indicated, and are under control of commercially available motion controller 19. Optical fiber 20 is signal-transmissively coupled to 16 by means of a conventional connector 21. The optical fiber transmission path between optical source 24 and fiber 16 comprises, in addition to fiber 20, optical fiber splitter 25, optical fiber 22, and optional optical isolator 26. Splitter 25 typically has a fixed splitting ratio (e.g., 1:1) and can be conventional, as can be isolator 26. The transmission path between fiber 16 and power-responsive means 27 (e.g., a conventional optical power meter) comprises fiber 23 and optional mode stripper 28. Controller 29 (e.g., a general purpose computer) receives the electrical output signal of 27 and provides control signals to motion controller 19, and typically also to bias means 15.

It will be recognized that the apparatus of FIG. 1 is exemplary only, and that the invention can be practiced with other equipment. For instance, fiber 16 and connector 21 can be readily omitted if the proximal end of fiber 20 is held in positioning means 18.

After preliminary positioning of the proximal end of fiber 16 relative to first region 17 (typically by conventional means, for instance, using software obtained from Newport Corporation in conjunction with the apparatus of FIG. 1 in a process that involves detection of radiation from LED 11), the LED is turned off and optical source 24 is turned on (typically under computer control), with radiation of the appropriate wavelength (e.g., 1.3 μm) transmitted through the optical fiber transmission path to the proximal end of optical fiber 16 and emitted therefrom. At least a part of the radiation is reflected from the first region 17, coupled into the proximal end of 16, and is transmitted to splitter 25. A part of the reflected radiation travels from 25 towards optical source 24, and a second part travels towards power meter 27, where it is detected and an output signal proportional to the power of the detected radiation is produced. This output signal is supplied to computer 29, wherein it (or a signal derived therefrom) is compared to a pre-determined set-point value. Based on the result of the comparison the computer provides a signal to motion controller 19, such that the proximal end of fiber 16 is moved to a new position relative to first region 17.

Exemplarily, optical source 24 is a commercially available 1.3 μm LED, bias supply 15 is a Keithley 238 High Current Source Measure Unit, positioning means 18 and motion controller 19 are part of a Newport PM500 Precision Motion Control System, power meter 27 is a Hewlett-Packard (HP) 8153A Lightwave Multimeter with HP 81532A Power Sensor, and computer 29 is a AT&T 6386/25 WGS computer. The fiber was conventional multimode fiber. Components not specifically described are conventional.

The above described fiber positioning subsequent to the preliminary positioning involves adjustment of Δz, the distance between the first region of the device and the proximal end of the fiber. However, final x-y adjustment is not excluded, although in many cases it will not be necessary.

Figure 2:
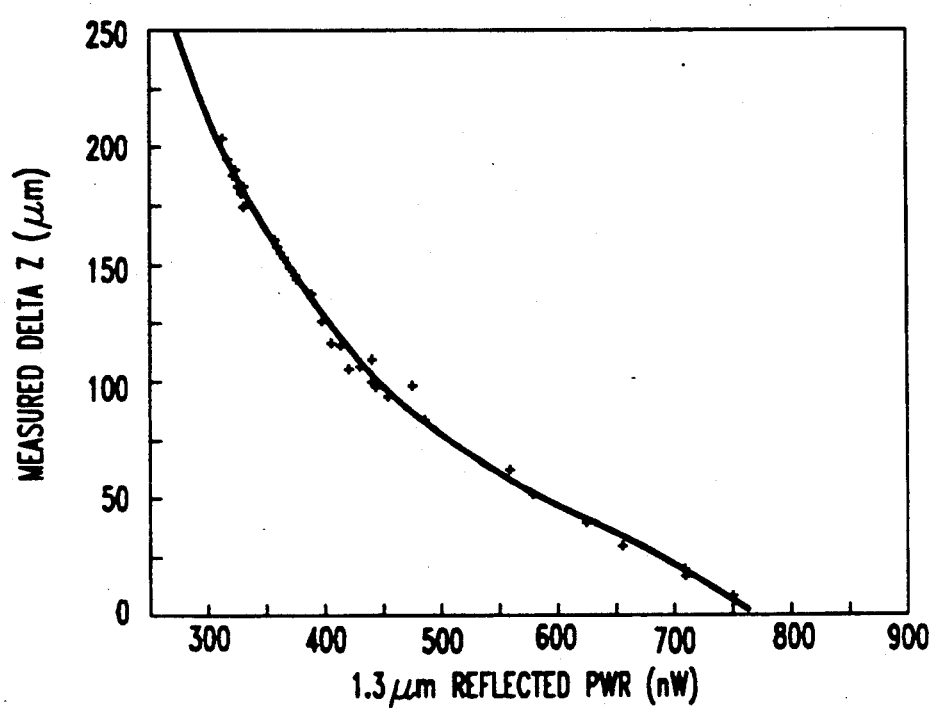
FIG. 2 shows exemplary data on reflected power vs. Δz.

A significant aspect of the inventive method is the comparison of a signal proportional to the reflected power (or of a signal related thereto) with a predetermined set-point value. FIG. 2 shows exemplary measured data of Δz vs. reflected power, obtained on apparatus substantially as shown in FIG. 1 (but varying Δz manually, and measuring Δz with an optical microscope), for a particular LED design that comprises a planar first region. The measured data can be fit very well (r=0.998) with a third order polynomial, and curve 30 is the plot of the polynomial ($\Delta z = 912.7 - 3.7762(RP) + 5.783 \times 10^{-3}(RP)^2 - 3.15 \times 10^{-6}(RP)^3$, where "RP" is the reflected power in nW at a wavelength of 1.3 μm). Those skilled in the art will appreciate that it is convenient but not necessary that a mathematical representation of measured Δz vs. reflected power be obtained, and that alternatively the required data could be stored in the form of a look-up table. Those skilled in the art will also appreciate that the inventive method permits either a multi-step or a single-step approach to the pre-determined Δz value, and both possibilities are contemplated.

Figure 3:
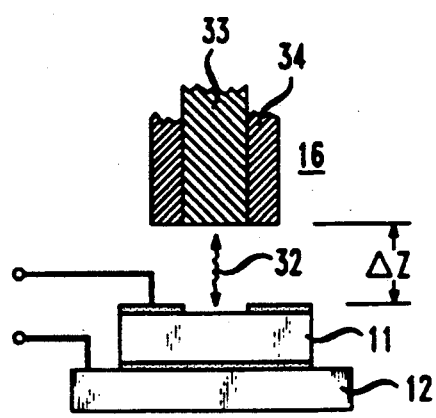
FIG. 3 schematically depicts a LED with the proximal end of an optical fiber.

FIG. 3 schematically depicts an exemplary arrangement wherein test radiation 32 from the proximal end of optical fiber 16 (which comprises a core 33 and a cladding 34; an optional polymer coating is not shown) is reflected from LED 11 back into the core region of the fiber.

Although the discussion so far has mostly been in terms of LEDs, those skilled in the art will undoubtedly have recognized that the inventive method can readily be adapted to detector diodes. In that case the invention can be practiced with apparatus as shown in FIG. 1, except that optional means for detecting a detector current frequently will be provided. These means can be used for the preliminary x, y, and z adjustment of the proximal end of the optical fiber relative to the first region of the detector diode, as will be evident to those skilled in the art. Exemplarily, an algorithm similar to that used in the above referred to commercially available program could be used. After completion of the preliminary adjustment the inventive Δz-adjustment is carried out as described above.

Exemplarily, the inventive method is used as part of a device testing procedure. The result of the procedure is a go/no go decision relative to a tested device. The passed devices can be incorporated into a variety of articles. Exemplary of these is an optical datalink transmitter/receiver pair such as AT&T's ODL ®-50.

Figure 4:
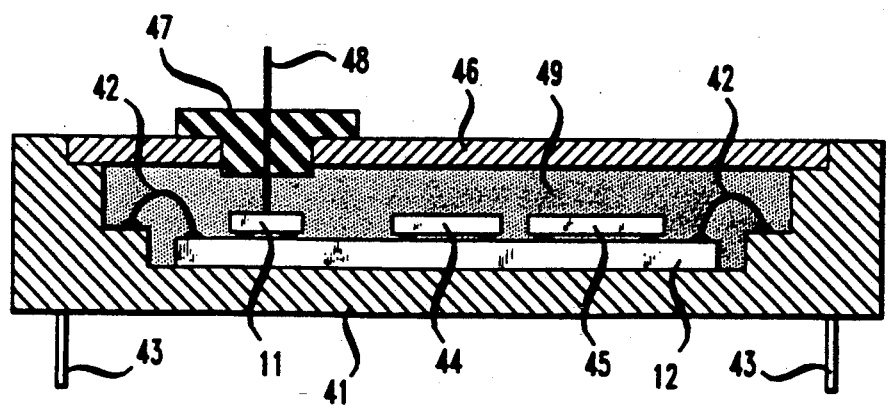
FIG. 4 shows schematically an exemplary article produced according to the invention, namely, a pigtailed optical transmitter or receiver.

FIG. 4 schematically depicts an exemplary article produced according to the invention, wherein numeral 11 refers to the opto-electronic device and 48 to a length of optical fiber held in fixed position relative to 11 by lid insert 47 in lid 46. Numeral 41 refers to a housing, 12 to an appropriate substrate (header), 44 and 45 to (optional) IC chips mounted on 40, and 42 and 43 to conventional contact wires and contact pins, respectively. After threading of the fiber through insert 47 and positioning, by a process that comprises $\Delta z$-adjustment according to the invention, of the fiber end relative to the first region of the opto-electronic device, the fiber end is secured by appropriate means, e.g., by epoxy 49.

We claim:

1. Method of making an article that comprises an opto-electronic device comprising a semiconductor body and means for making electrical contact to the semiconductor body, the semiconductor body having a surface comprising an essentially planar first region, associated with the first region being a z-direction that is normal to the first region and an x-y plane that is normal to the z-direction; the method comprising
   a) providing and electrically contacting the semiconductor body;
   b) providing a length of optical fiber, the fiber having a proximal end;
   c) adjusting the relative position of the semiconductor body and the optical fiber such that the proximal end of the optical fiber is spaced from, and facing, the first region, with at least the proximal end of the fiber being essentially parallel to the z-direction, and
   such that the proximal end of the optical fiber is spaced a specified distance $\Delta z$ from the first region; and
   d) carrying out one or more steps towards completion of the article;
   CHARACTERIZED IN THAT
   step c) comprises
   i) providing a test radiation source and causing test radiation from said source to be transmitted, through an optical fiber transmission path that comprises said optical fiber and optical fiber splitter means, to the proximal end of the optical fiber and therefrom to said first region, with at least a portion of the test radiation being reflected from the device, being coupled into the proximal end of the optical fiber and returning to said splitter means, with at least part of the returning test radiation being transmitted from the splitter means to power-responsive means for providing an output that is substantially proportional to the test radiation power received by said power-responsive means;
   ii) providing means for comparing said output, or a quantity derived therefrom (collectively the "measurement value"), to a specified set-point value, causing said means to compare said measurement value and said set-point value and, if said comparison indicates the existence of a difference between said measurement value and said set-point value,
   iii) adjusting the distance of the proximal fiber end relative to the first region such as to reduce the difference between the measurement value and the set-point value.

2. Method according to claim 1, wherein the opto-electronic device is a light emitting diode (LED).

3. Method according to claim 1, wherein the opto-electronic device is a photodetector diode.

4. Method according to claim 1, wherein step d) comprises selecting an opto-electronic device that meets specified performance criteria and mounting the device in a housing.

5. Method according to claim 1, wherein step d) comprises fixing the proximal end relative to the first region, with the device and the proximal end positioned inside an enclosure.

* * * * *